United States Patent [19]
Cain

[11] 3,886,382
[45] May 27, 1975

[54] BALANCED SUPERCONDUCTIVE TRANSMISSION LINE USING JOSEPHSON TUNNELLING DEVICES

[75] Inventor: Robert G. Cain, Poughkeepsie, N.Y.

[73] Assignee: International Business Machines Corporation, Armonk, N.Y.

[22] Filed: Dec. 27, 1973

[21] Appl. No.: 428,974

[52] U.S. Cl. ................ 307/245; 307/212; 307/277; 307/306; 340/173.1; 357/5
[51] Int. Cl. ......................... H03k 3/38; H03k 17/00
[58] Field of Search ........... 307/212, 277, 245, 306; 340/173.1; 357/5

[56] References Cited

UNITED STATES PATENTS

| | | | |
|---|---|---|---|
| 3,281,609 | 10/1966 | Rowell | 307/306 |
| 3,626,391 | 12/1971 | Anacker | 340/173.1 |
| 3,758,795 | 9/1973 | Anacker et al. | 307/306 |
| 3,843,895 | 10/1974 | Hamel et al. | 307/212 |

*Primary Examiner*—Stanley D. Miller, Jr.
*Attorney, Agent, or Firm*—Harold H. Sweeney, Jr.

[57] ABSTRACT

Superconductive circuitry is provided which consists of a transmission line having a terminal at each end thereof across which the output is measured, and which includes a plurality of pairs of Josephson tunnelling devices where each Josephson tunnelling device of a pair is located in the transmission line equally distant from opposite end terminals thereof so that the transmission line is balanced. Each of the Josephson tunnelling devices has a zero voltage and a finite voltage state. Control means are provided for simultaneously controlling the voltage switching point of each Josephson device of each pair of said Josephson devices. The transmission line is pulsed with a current so that each Josephson tunnelling device of each pair of devices which are biased by the control means will switch into the finite voltage state causing reflections in the transmission line in a balanced manner so that the transmission line stabilizing time is minimized.

9 Claims, 6 Drawing Figures

BALANCED SUPERCONDUCTIVE TRANSMISSION LINE USING JOSEPHSON TUNNELLING DEVICES

BACKGROUND OF THE INVENTION

1. Field of the Invention

This invention relates to circuitry using Josephson tunnelling devices and more particularly, to superconductive circuitry in which a transmission line utilizes Josephson tunnelling devices in pairs so that the transmission line is always balanced.

2. Description of the Prior Art

Josephson tunnelling devices are superconductive elements exhibiting a zero voltage current state in which pair tunnelling exists, and a finite voltage state in which single particle tunnelling exists. The existence of a zero voltage stage in a superconductive tunnel junction was first described in July 1962 by B. D. Josephson. Since that time, these devices have been proposed for applications in memory and logic. For instance, U.S. Pat. No. 3,626,391 describes a superconductive memory using Josephson tunnelling devices in which memory cells comprised of superconducting loops are used. Josephson junctions determine the direction of current flow in the superconducting loops and they are also used for sensing the current in these loops.

U.S. Pat. No. 3,281,609 describes a logic device using Josephson tunnelling junctions in which the magnetic fields applied to the junction cause the junction to switch voltage states, depending on whether or not the maximum zero voltage current through the junction is exceeded. Externally applied magnetic fields are used to lower the threshold current (zero voltage current) of the tunnel junction so that switching to a finite voltage state occurs.

U.S. Pat. No. 3,758,795 teaches a way of taking full advantage of the high speed capabilities of Josephson tunnelling devices. A single Josephson device is shown in a transmission line wherein the line is terminated such that there are no reflections or stabilization problems in the transmission line. However, this patent does not teach how to prevent transmission line problems caused by reflections and settling time when a number of Josephson devices are tied into the line. For example, the present invention contemplates a transmission line used as a read out line for a logic array wherein the elements being read are the voltage states of pairs of Josephson devices connected into the transmission line.

Applicant has discovered how to balance a transmission line which includes a plurality of Josephson devices so that the circuit speed is consistent with the speed of switching of Josephson tunnelling devices. The invention finds a particular application in logic array circuits utilizing Josephson tunnelling devices, and an embodiment specifically for logic array application will be shown as a preferred embodiment in this application.

Accordingly, it is a primary object of the present invention to provide a transmission line using Josephson tunnelling devices which is balanced.

It is another object of this invention to provide a transmission line using Josephson tunnelling devices whose speed is consistent with the switching speed of the individual tunnel junctions.

It is a further object of this invention to provide a superconductive transmission line using Josephson tunnelling devices which can be used as a high speed read circuit.

It is a further object of this invention to provide high speed Josephson tunnelling device circuits which can be easily fabricated using conventional planar technology.

BRIEF SUMMARY OF THE INVENTION

A superconductive transmission line is provided in which a plurality of pairs of Josephson tunnelling devices are connected. Each Josephson tunnelling device of a pair is located in the transmission line equally distant from opposite end terminals thereof so as to provide a balanced transmission line. Each of the Josephson tunnelling devices has a zero voltage and a finite voltage state. Control means are introduced for simultaneously controlling the voltage switching point of each Josephson device of each pair of Josephson devices. A current pulsing means provides current to the transmission line and to each of the Josephson tunnelling devices of each pair of devices so that any pair of Josephson tunnelling devices, which is biased by the control means, will switch into the finite voltage state, thereby causing reflections in the transmission line in a balanced manner so that the transmission line stabilizing time is minimized.

As will be more fully appreciated in the following discussion, the speed of this transmission line is increased because of the balancing effect introduced by the use of the pairs of Josephson tunnelling devices. Since the reflections are caused on the line by the simultaneous switching of the Josephson devices which are at the same distance from the end terminals of the transmission line, there is essentially no imbalance and consequently a minimum line settling time.

BRIEF DESCRIPTION OF THE DRAWINGS

Referring to FIG. 1, there is shown a transmission line 10 which includes Josephson devices 12 and 14. The Josephson devices 12 and 14 are controlled by applying a current from the current sources I1 and I2, respectively, on the control lines 16 and 18. The current in control lines 16 and 18 generates a magnetic field which intercepts the associated Josephson junction causing the critical current value at which the device switches into the finite voltage state to be lower. The transmission line has a terminating resistor 20 and output terminals 22 which provide an output taken across the resistance 20. A current input is applied to the transmission line 10 by the current source 24 so that the Josephson device 12 or 14, which is biased by the presence of the control input current, will switch to the finite voltage state. The current supplied to the transmission line 10 is well below the critical current value at which the Josephson device switches from its no voltage to its finite voltage state. However, once an input current is supplied on control input 16 or 18 to Josephson device 12 or 14, the cricital current value is lowered so that the input current to the transmission line is sufficient to cause the Josephson tunnelling device to switch into its finite voltage state. The switching of the Josephson device into its finite voltage state causes reflections in the transmission line which travel towards the terminals 22. These reflections are caused by the current step from current source 24 reflecting from the switched device. It will be appreciated, that these reflections will arrive at terminating resistors 20 at different times and will tend to set up further reflections until the transmission line stabilizes. This slows down the transmission line response time and, accordingly, limits the effectiveness of the high speed switching of the Josephson devices.

Figure 1:
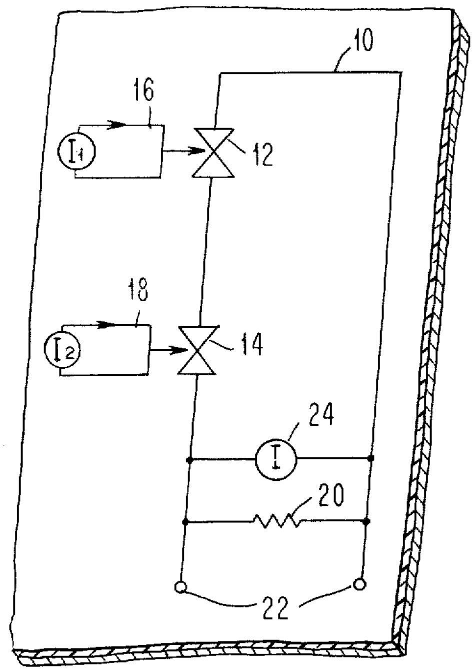
FIG. 1 PRIOR ART
FIG. 1 is a schematic illustration of a superconductive transmission line having Josephson devices connected therein which is representative of the unbalanced line of the prior art.
Figure 2:
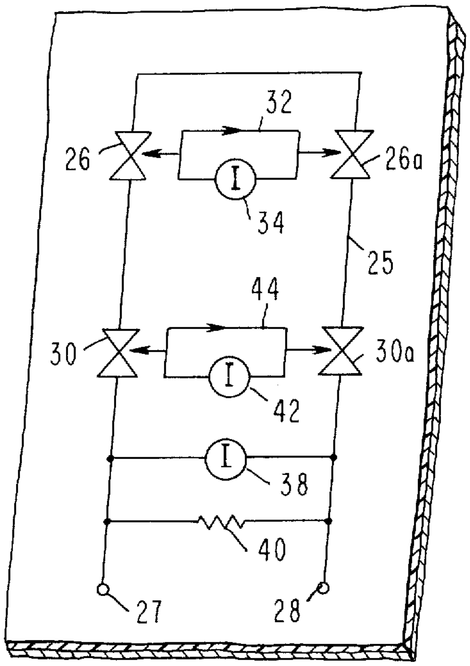
FIG. 2 is a schematic illustration of a superconductive transmission line having a plurality of Josephson tunnelling devices connected therein in such a way as to provide a balanced line.

These problems, in the prior art arrangement, are overcome by the arrangement shown in FIG. 2. The most important thing to be noted in FIG. 2 is that the Josephson devices are inserted into the transmission line in pairs which are simultaneously controlled, and each Josephson device of each pair is located equally distant from an output terminal so that the transmission line is essentially balanced. The first pair of Josephson tunnelling devices 26 and 26*a* are shown connected in the transmission line 25 equally distant from the terminals 27 and 28, respectively. Likewise, a second pair of Josephson devices 30 and 30*a* are shown, each connected in the transmission line 25 an equal distance from the respective terminals 27 and 28. The control means for the pair of Josephson devices 26 and 26*a* is shown located between the devices. The control means consists of control line 32 and current source 34. This control current is of sufficient magnitude to lower the point at which the Josephson devices 26 and 26*a* switch into their finite voltage state. Once a current pulse is applied to the transmission line from the current source 38, the Josephson devices 26 and 26*a*, both of which have lowered switching points, will switch into their finite voltage condition.

In operation current source 38 generates a current step which results in a current pulse traveling down the transmission line. If no Josephson device pairs are in the finite voltage state, the current will travel through the superconducting loop and no voltage will appear at terminals 27 and 28. If any pair of Josephson devices is switched into the finite voltage state, the transmission line will effectively appear to be terminated by an open circuit at the first such pair and the current pulse will reflect back to the matching resistor 40 and be absorbed. Nearly all the current will now be traveling through the resistor, since the transmission line is effectively an open circuit and a voltage will appear at the terminals 27 and 28. Thus, the reflections set up in the transmission line 25 as a result of the switching of the pairs of Josephson devices will be available at the same time at terminals 27 and 28 so that there is minimal delay in waiting for the line to settle out. Similarly, if a control current is applied to Josephson devices 30 and 30*a* from current source 42 on control line 44, these Josephson devices 30, 30*a* will be biased so as to switch into their finite voltage state when a current pulse is applied to the transmission line by the current pulse source 38. Similarly, a voltage can be measured across resistor 40 representing that a pair of devices have switched. It will be appreciated, that the transmission line 25 shown in FIG. 2 is capable of providing an output when any of the pairs of Josephson devices connected thereto are switched. The line is balanced such that the reflections both arrive at the output terminals essentially simultaneously. Accordingly, there is no waiting period while the transmission line stabilizes. Also, the high speeds of the Josephson tunnelling devices are not limited by the transmission line speed.

Figure 3:
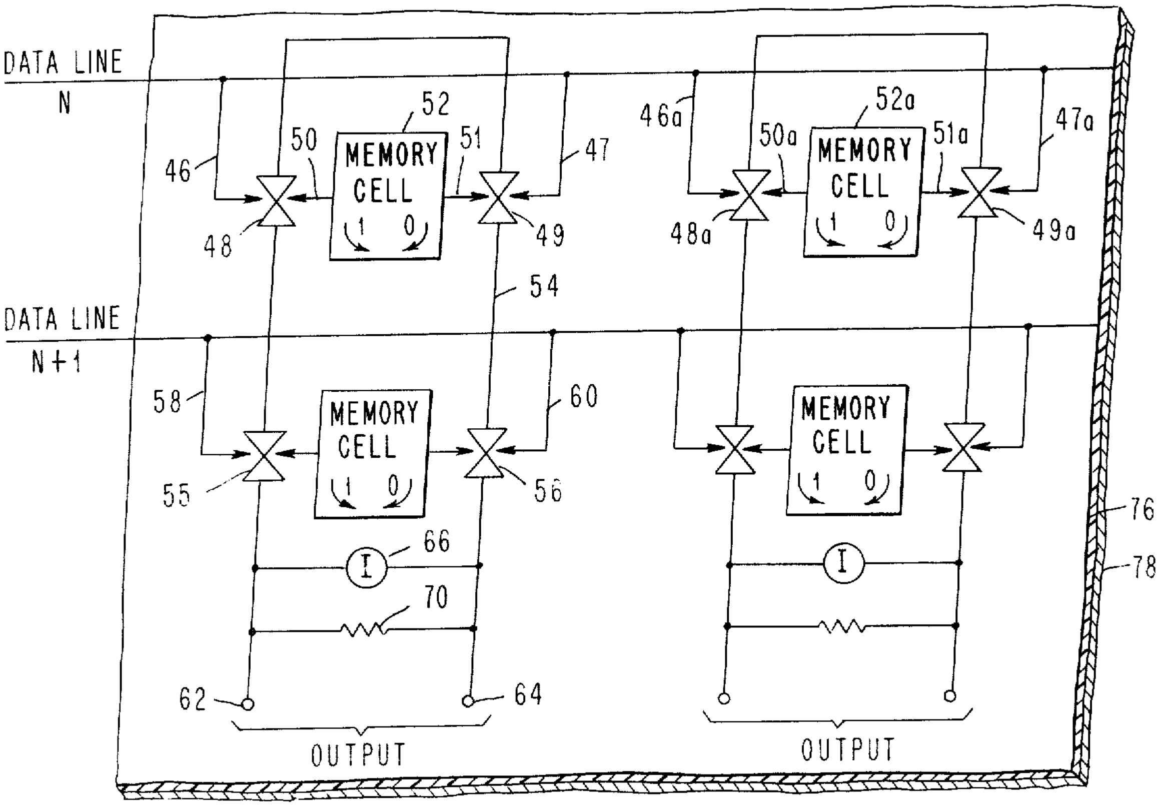
FIG. 3 is a schematic representation showing the superconductive transmission line utilized as the readout in an array logic embodiment.

One application of the invention is shown in FIG. 3, where the transmission line utilizing the Josephson devices in pairs for obtaining a balanced line is incorporated into a matrix array where the transmission line is used as a readout line for the array. In the array, the data input lines *n*, *n*+1, etc., are shown as the row inputs to the array. The data line *n* is shown having a control input 46 and a control input 47 to Josephson devices 48 and 49, respectively. The Josephson tunnelling devices 48 and 49 have a second control input 50 and 51 which is obtained from a memory cell 52. For our purposes, the memory cell has a circulating current, the direction of which is indicative of the content of the cell. For example, rotation of the current in the clockwise direction represents a 0 content of the memory, while a counterclockwise rotation represents a 1. It will be appreciated that this input is not limited to an input from memory but could be a bit line input in a matrix arrangement, etc. The simultaneous application of the current supplied by the control line inputs 46 and 50 is sufficient to bias the Josephson device 48 so as to have a lower switching point at which it will switch into its finite voltage state. These same currents are applied simultaneously to the second Josephson device 49 of the pair via control lines 47 and 51. Thus both Josephson devices 48 and 49 are simultaneously biased into their lower voltage switching point state. It can be seen, that the same data line *n* inputs are applied to further pairs of Josephson devices in the row such as 48*a* and 49*a* via the control inputs 46*a* and 47*a*, respectively. The memory cell 52*a* is connected to the Josephson devices 48*a* and 49*a* simultaneously by the control line inputs 50*a* and 51*a*. A similar application of the data line *n* input is made to any further pairs of Josephson devices and memory cell combinations connected to the line. It will be appreciated, that the other data line inputs, such as data line *n*+1, also provide an input to pairs of Josephson devices connected thereto. The columns of the matrix consist of the readout lines or transmission lines of the present invention. For example, transmission line 54 is shown as the first column in the array. Also shown are the pair of Josephson devices 55 and 56 connected directly in the transmission line 54. It should be noted, that this pair of Josephson devices is connected to the data line *n*+1 through control inputs 58 and 60, respectively. Similarly, the Josephson devices 48 and 49 are connected into the transmission line 54 in a balanced manner. This means that Josephson device 48 is connected the same distance from terminal 62 as Josephson device 49 is connected from the terminal 64. It will be appreciated, that the simultaneous switching of these Josephson devices will provide the same result on each half of the transmission line, accordingly, providing a completely balanced line. Whan an input pulse from input current pulse source 66 is applied to the transmission line 54, the pair or pairs of Josephson devices which have been biased so as to have a lower voltage switching point by the simultaneous reception of data and the correct memory content, will switch. In other words, when the control lines carry sufficient current to bias the Josephson device so that it has a lower voltage switching point, the device will switch when the current pulse applied on the transmission line from the current source 66 is above the lower voltage switching point. Of course, the current must be below the switching point of the now biased Josephson devices. The reading out of this condition is almost instantaneous and, thus, utilizes the high speed Josephson devices in a readout arrangement of essentially the same high speed. The readout produced by the switching of any pair or pairs of Josephson devices in the transmission line column is taken across the resistor 70 at the terminals 62 and 64. Each of the columns of the matrix array is similarly utilized to readout the status of the pairs of Josephson devices connected thereto.

Figures 4, 4A:
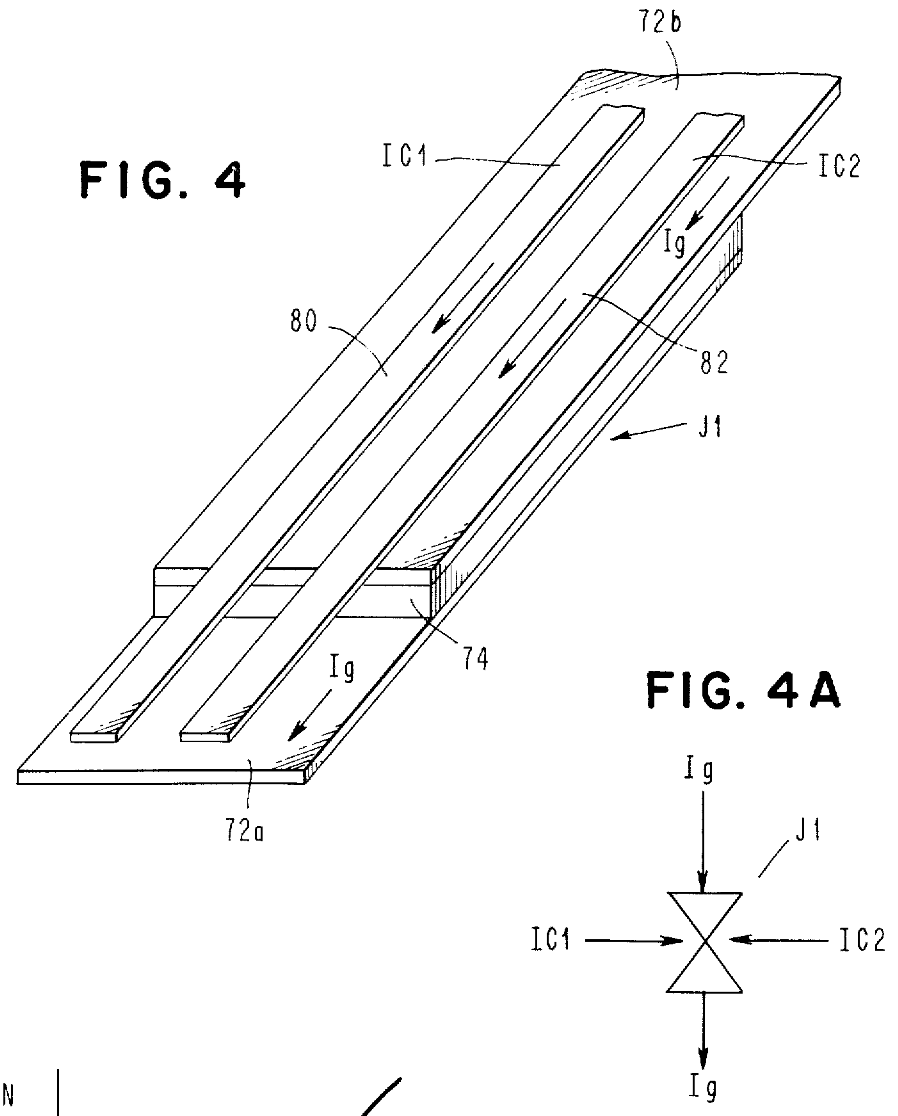
FIG. 4 is a diagram illustrating the structure of a portion of the transmission line including the control means and Josephson tunnelling junction shown in FIG. 3.
FIG. 4*a* is a schematic representation of the structure shown in FIG. 4.

FIG. 4 shows the structure of a portion of transmission line including a typical one of the Josephson tunnelling devices utilized in FIG. 3. The symbolism utilized therewith is shown in FIG. 4*a*. Each of the Josephson tunnelling devices is constructed similarly and is comprised of superconductive electrodes 72*a* and 72*b* which are separated by a tunnel barrier 74. The electrodes are fabricated from known superconductive materials, such as lead or tin. Preferably, tunnel barrier 74 is an oxide of the base electrode 72, and can be for instance, lead-oxide. The manner of construction of a Josephson tunnelling junction is well understood in the art and will not be described further here. The transmission line 54 is comprised of superconductive strip lines similar to the electrodes for the Josephson device. The strip lines are deposited by known processes such as evaporation or sputtering. In FIG. 3, for example, the transmission lines are deposited on an insulative layer 76 which is located over a superconductive ground plane 78.

The control conductors, such as control conductors 46 and 47 are generally superconductive lines, although they need not be superconductive. These control lines are shown in FIG. 4 as control lines 80 and 82 extending over the Josephson junction J1. These superconductive control lines 80 and 82 when energized by current flowing therein produce a magnetic field which couples to the junction, thereby controlling the operation thereof. These control currents are represented in FIG. 4A as IC1 and IC2 shown on the control lines 80 and 82, respectively. The current Ig is shown schematically passing from top to bottom through the Josephson device.

Figure 5:
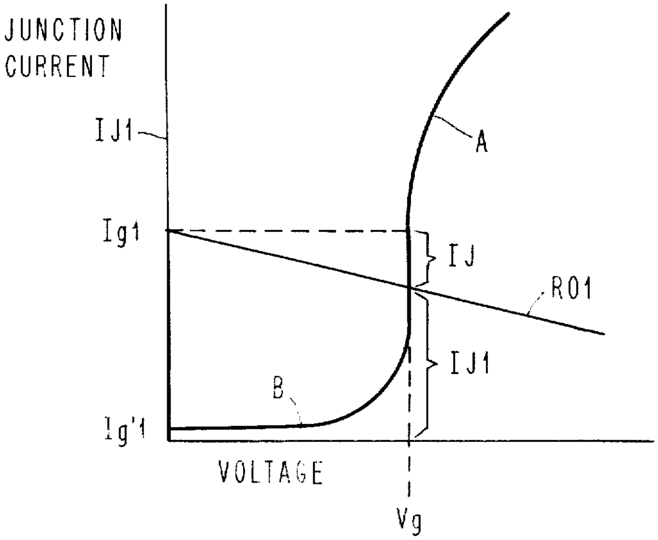
FIG. 5 is a plot of tunnel junction current versus tunnel junction voltage for a Josephson tunnel junction, used to illustrate the operation of the circuit shown in FIGS. 2 and 3.

FIG. 5 shows the plot of Josephson junction current IJ1 through Josephson tunnel junction J1, plotted as a function of the voltage V across the junction J1. This plot shows the conventional curve denoting pair tunnelling through the junction in the zero voltage state and single particle tunnelling through the junction in the finite voltage state. That is, currents up to a magnitude of Ig1 will flow through the junction in its zero voltage state. When current IJ1 through the junction exceeds this value, the junction will rapidly switch to a finite voltage state, at which time the voltage across the junction will be a band gap voltage Vg. When current through the junction is decreased to a value less than Ig1, the voltage across the junction will follow the curve indicated by portions A and B back to the zero voltage state.

A load line indicated by the designation RO1 is also shown in FIG. 4. This load line will be used to explain the operation of the circuit of FIG. 4 when the Josephson tunnel device J1 is switched in accordance with current supplied to a plurality of control conductors such as 80 and 82.

Assume that junction J1 is in its zero voltage state, and a current Ig1 flows through the device. If a sufficient magnetic field set up by the two control conductors 80 and 82 now intercepts J1 such that the critical current value is lowered to a value less than Ig1, tunnel device J1 will immediately switch to a finite voltage state. Thus, it will be appreciated that the control conductors 80 and 82, when they both have currents passing therethrough, will set up a magnetic field which intercepts junction J1 so that the critical current value at which switching takes place is lowered. The junction is essentially biased so that it will switch when a current above that critical value is applied. The current pulse applied to the transmission line to provide reading is above the lowered critical value and will cause the device to switch to its finite voltage state. The load line is generally chosen so that the current IJ1 always stays above I'G1 (minimum Josephson current) to avoid relaxation oscillations in the circuit.

Tunnel device J1 will switch to its finite voltage state following a path given by the load line RO1. If the current IJ1 is then lowered such that Ig1-I1 < I'G1, tunnel device J1 will switch back to its zero voltage state.

While the invention has been particularly shown and described with reference to the embodiment thereof, it will be understood by those skilled in the art that the foregoing and other changes in form and detail may be made therein without departing from the spirit and scope of the invention.

What is claimed is:

1. In a transmission line having a terminal at each end thereof across which the output is measured;

a plurality of pairs of Josephson tunnelling devices, each Josephson tunnelling device of a pair being located in the transmission line equally distant from opposite end terminals thereof to provide a balanced transmission line, each Josephson tunnelling device having a zero voltage and a finite voltage state;

control means for simultaneously controlling the voltage switching point of each Josephson device of each pair of said Josephson tunnelling devices;

current means for providing electrical current through said transmission line and each of said Josephson tunnelling devices of each pair of devices causing any pair of Josephson tunnelling devices biased by said control means to simultaneously switch into its finite voltage state, thereby causing reflections in the transmission line in a balanced manner so that the transmission line stabilizing time is minimized.

2. In a transmission line according to claim 1, wherein said transmission line is a strip line insulated from a ground plane and which has a termination impedance equal to the characteristic impedance of the transmission line across which the transmission line output is measured.

3. In a transmission line according to claim 1, wherein said control means includes at least one current carrying line located adjacent each Josephson device of each pair of Josephson devices, current through said current carrying line producing a magnetic field which intercepts each of said Josephson devices of each pair.

4. In a transmission line according to claim 1, wherein each of said Josephson tunnelling devices of each pair are planar devices.

5. In a logic array;

a transmission line;

a plurality of pairs of Josephson devices, each Josephson device of each pair being connected into said transmission line equidistant from opposite output terminals of said transmission line;

a first and second control means located adjacent each of said Josephson devices of each pair of devices for controlling the critical current point of said Josephson devices, at which switching to the finite voltage state takes place;

current means for providing electrical current through said transmission line of each of said Josephson tunnelling devices of each pair of devices causing any pair of Josephson tunnelling devices biased simultaneously by said first and second control means into the finite voltage state to switch into said finite voltage state, thereby causing reflections in the transmission line in a balanced manner so that the transmission line stabilizing time is minimized.

6. In a logic array according to claim 5, wherein said transmission line is a strip line insulated from a ground plane and which serves as the read line for said logic array.

7. In a logic array according to claim 5, wherein said first control means includes data input lines forming the rows of said logic array for providing current therein which generates a magnetic field intercepting the pairs of Josephson devices adjacent thereto.

8. In a logic array according to claim 7, wherein said second control means includes a memory cell for providing current in accordance with the content of said cell which generates a magnetic field intercepting the pairs of Josephson devices adjacent thereto.

9. In a logic array according to claim 8, wherein said pairs of Josephson devices are switched into the finite voltage state when the first and second control means produce the current biasing and said current means provides the electrical current simultaneously.

* * * * *